(12) United States Patent
Lee et al.

(10) Patent No.: US 7,653,990 B2
(45) Date of Patent: Feb. 2, 2010

(54) MANUFACTURING METHOD OF PRINTED CIRCUIT BOARD USING AN INK JET

(75) Inventors: Choon-Keun Lee, Suwon-si (KR); Myeong-Ho Hong, Suwon-si (KR); Senug-Hyun Ra, Seongnam-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 238 days.

(21) Appl. No.: 11/785,096

(22) Filed: Apr. 13, 2007

(65) Prior Publication Data

US 2008/0016686 A1 Jan. 24, 2008

(30) Foreign Application Priority Data

Jul. 18, 2006 (KR) .................. 10-2006-0066946

(51) Int. Cl.
*H05K 3/10* (2006.01)
*H05K 3/02* (2006.01)

(52) U.S. Cl. ............... 29/846; 29/831; 29/833; 29/835; 430/313; 430/319; 264/104; 264/225; 174/257

(58) Field of Classification Search .......... 174/250, 174/254–261; 29/834, 846, 850, 829, 830, 29/832; 264/104, 227, 319; 430/314, 319
See application file for complete search history.

(56) References Cited

U.S. PATENT DOCUMENTS

| 4,137,628 A * | 2/1979 | Suzuki | 29/827 |
| 6,310,304 B1 * | 10/2001 | Hayama et al. | 174/264 |
| 2003/0006067 A1 * | 1/2003 | Sedberry | 174/261 |
| 2006/0170836 A1 * | 8/2006 | Kondo et al. | 349/43 |
| 2008/0012168 A1 * | 1/2008 | Ra et al. | 264/104 |
| 2008/0034581 A1 * | 2/2008 | Ra et al. | 29/834 |

FOREIGN PATENT DOCUMENTS

| JP | 61-221392 | 10/1986 |
| JP | 2-185090 | 7/1990 |
| JP | 8-181413 | 7/1996 |
| JP | 2000-334947 | 12/2000 |
| JP | 2001-196703 | 7/2001 |
| JP | 2001-351448 | 12/2001 |
| JP | 2003-82469 | 3/2003 |
| JP | 2004-356255 | 12/2004 |
| KR | 2003-0071762 | 9/2003 |
| KR | 10-2005-0089826 | 9/2005 |

* cited by examiner

*Primary Examiner*—Derris H Banks
*Assistant Examiner*—Jeffrey Carley

(57) ABSTRACT

A manufacturing method of printed circuit board print is disclosed. A method of manufacturing a PCB which includes providing an imprinting stamper with a relievo pattern formed in correspondence with a circuit pattern data using the circuit pattern data, forming an intaglio pattern corresponding to the relievo pattern by pressing the imprinting stamper on an insulation layer, and forming a circuit pattern by printing conductive ink in the intaglio pattern by an ink-jet method using the circuit pattern data, allows the forming of a circuit pattern to a required thickness by injecting conductive ink in a groove processed by the imprint method, and prevents the spreading of ink and the distortion of the pattern shape in the curing process for conductive ink containing metal Also, the circuit pattern CAD data used in the manufacturing of an imprinting stamper can be utilized again in the ink-jet printing process.

14 Claims, 5 Drawing Sheets

MANUFACTURING METHOD OF PRINTED CIRCUIT BOARD USING AN INK JET

CROSS-REFERENCE TO RELATED APPLICATIONS

This application claims the benefit of Korean Patent Application No. 10-2006-0066946 filed with the Korean Intellectual Property Office on Jul. 18, 2006, the disclosure of which is incorporated herein by reference in its entirety.

BACKGROUND

1. Technical Field

The present invention relates to a manufacturing method of a printed circuit board.

2. Description of the Related Art

A printed circuit board is a thin plate to which electrical components such as integrated circuits, resistors, or switches are soldered. The circuit used in most electronic products such as computers are installed on the printed circuit board.

Usually, a printed circuit board is manufactured by laminating a copper foil on a thin substrate made of epoxy resin or bakelite resin which is an insulation, printing an etching resist selectively only on the parts where the copper foil is to remain and form a circuit pattern, selectively etching only the parts where the etching resist is not covered by dipping the printed substrate in an etchant, and then removing the etching resist to form the circuit pattern. As a post-processing procedure, a hole is perforated where an electronic component is to be mounted and solder resist is spread where solder is not to be covered, whereby the manufacturing of the printed circuit board is complete.

As methods of printing a circuit pattern on an insulation substrate, a variety of methods have recently appeared as follows. A first method is the imprinting method, where the pattern formed on a stamper is transferred to a polymer resin by pressing or heat-pressing the stamper, which has a relievo pattern corresponding to the circuit pattern protruding from its surface, onto a polymer resin or liquid monomer and hardening by heat or ultraviolet (UV) rays. However, this method entails the limitation that the circuit pattern has to be formed by plating inside the pattern transferred onto the resin.

A second method is the ink-jet method of printing the required circuit pattern by jetting any of a variety of inks having various ingredients such as polymer, metal, etc., through a nozzle of an ink-jet head, and a third is the stencil method of printing a circuit pattern by ejecting ink through a lattice mesh on which a particular pattern is perforated. However, these methods have the problem that it is hard to form the required thickness of a circuit pattern due to the spreading of the ink, etc.

SUMMARY

Certain aspects of the present invention provide a manufacturing method of a printed circuit board by which a circuit pattern of thickness greater than a certain value can be formed by forming an intaglio pattern on an insulation layer using imprinting technology, and printing conductive ink in the intaglio pattern using the ink-jet method.

One aspect of the present invention provides a method of manufacturing a PCB which includes providing an imprinting stamper with a relievo pattern formed in correspondence with a circuit pattern data using the circuit pattern data, forming an intaglio pattern corresponding to the relievo pattern by pressing the imprinting stamper on an insulation layer, and forming a circuit pattern by printing conductive ink in the intaglio pattern by an ink-jet method using the circuit pattern data.

The providing of the imprinting stamper may include making a master mold with a master pattern corresponding to the circuit pattern data formed in intaglio, laminating a molding material on the master mold such that the molding material is filled in the master pattern, and separating the molding material from the master mold.

The making of the master mold may include printing the circuit pattern data on a mask film, and forming the master mold by laminating the mask film on a silicon wafer or a glass board and etching selectively.

The molding material may include one or more of a monomer and a polymer precursor, and the laminating may include spreading the molding material on the master mold, and polymerizing the molding material such that a pattern corresponding to the master pattern is formed in relievo on the molding material.

The molding material may include a polymer, and the laminating may include laminating the molding material on the master mold, and deforming the molding material by heating the molding material such that a pattern corresponding to the master pattern is formed in relievo on the molding material.

The method may further include forming a plating layer on a surface of the imprinting stamper after the separating. The laminating may include plating a surface of the master mold such that a plating layer is filled in the master pattern. The plating layer may comprise nickel (Ni).

The forming of the intaglio pattern may include laminating the insulation layer on a substrate and pressing the imprinting stamper, and demolding the imprinting stamper. The method may further include hardening the insulation layer by heat treatment after the demolding. The forming of the circuit pattern may include curing the conductive ink.

Another aspect of the present invention provides a printed circuit board which includes an insulation layer, an intaglio pattern formed by depressing a part of the insulation layer corresponding to a location where a circuit pattern is to be formed, and conductive ink forming the circuit pattern by filling the intaglio pattern.

The intaglio pattern may be formed by pressing an imprinting stamper on the insulation layer, with the imprinting stamper having a relievo pattern formed in correspondence with the circuit pattern. The conductive ink may be printed by an ink-jet method in the intaglio pattern.

Additional aspects and advantages of the present invention will become apparent and more readily appreciated from the following description, including the appended drawings and claims, or may be learned by practice of the invention.

DETAILED DESCRIPTION

The manufacturing method of a printed circuit board according to certain embodiments of the invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
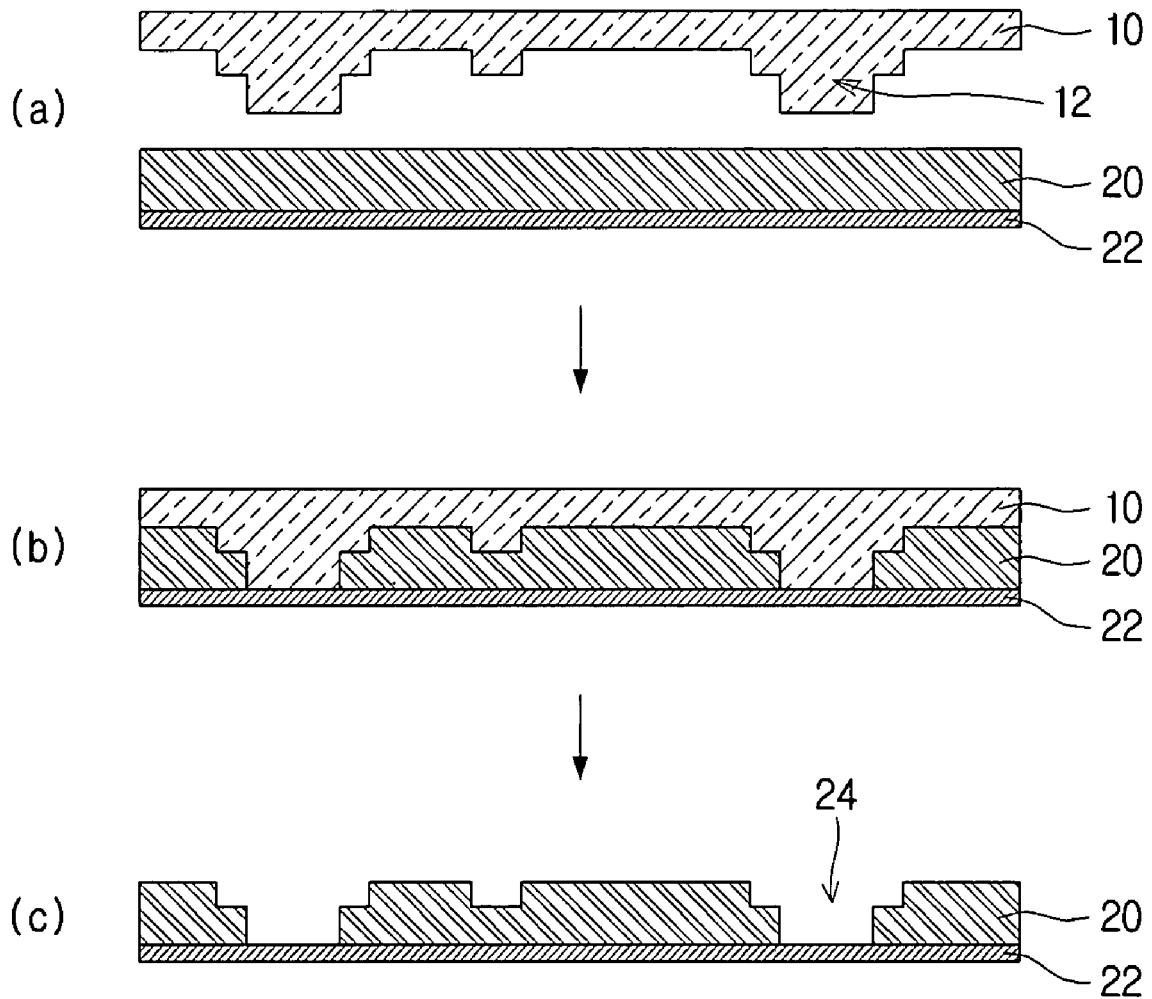
FIG. 1 is a flow diagram illustrating an imprinting process according to an embodiment of the present invention.
Figure 2:
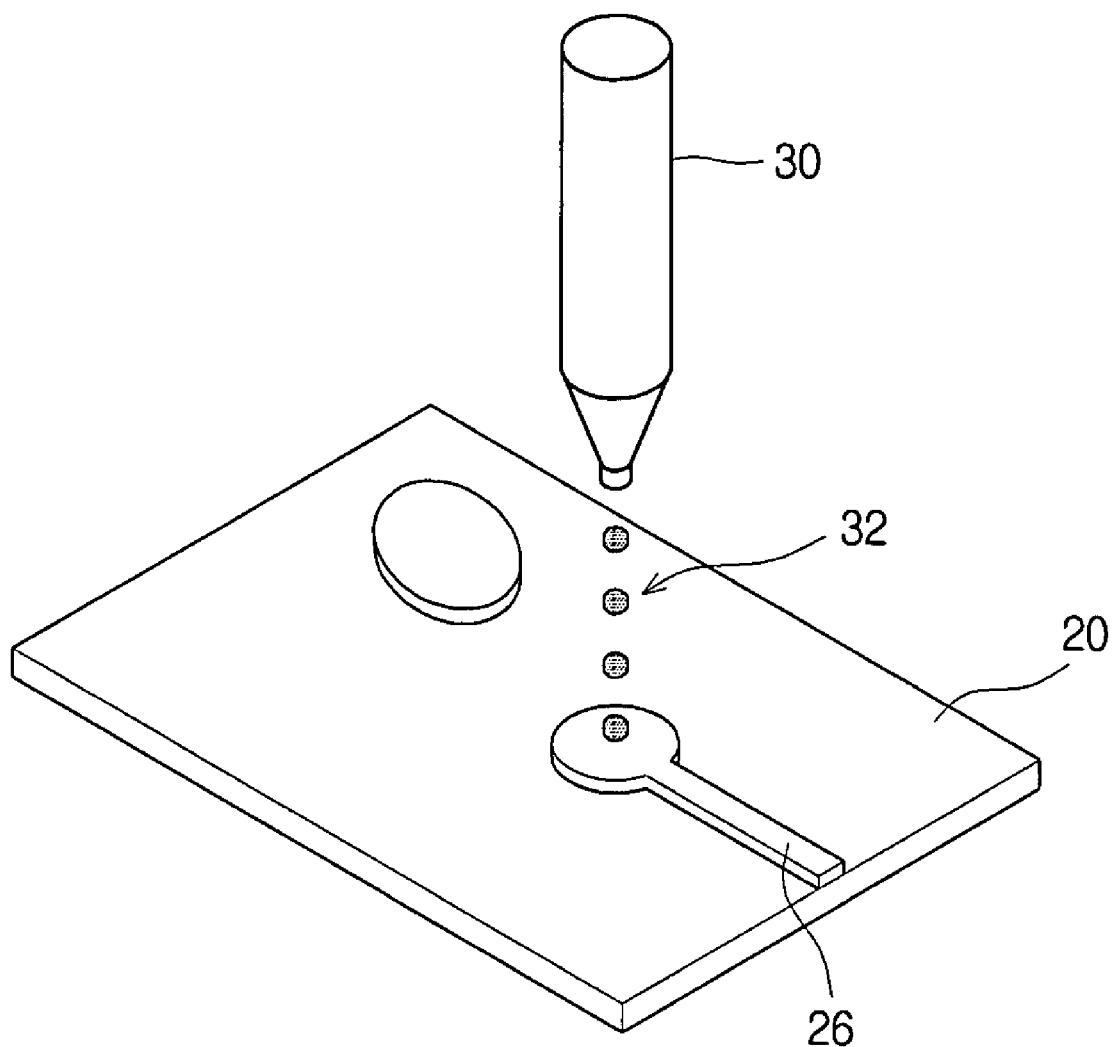
FIG. 2 is a schematic diagram illustrating an ink-jet printing process according to an embodiment of the present invention.

FIG. 1 is a flow diagram illustrating an imprinting process according to an embodiment of the present invention, and FIG. 2 is a schematic diagram illustrating an ink-jet printing process according to an embodiment of the present invention. In FIG. 1 and FIG. 2 are illustrated an imprinting stamper 10, a relievo pattern 12, an insulation layer 20, a substrate 22, an intaglio pattern 24, a circuit pattern 26, an ink-jet head 30, and conductive ink 32.

The present embodiment is characterized by the combination of the ink-jet printing technology with the imprinting pattern forming technology. After the pattern is imprinted to a polymer resin using an imprinting stamper 10, that is, a stamper on which a particular pattern is protruded in relievo, the conductive ink 32 is injected in the transferred intaglio pattern 24, that is a trench, using an ink-jet printing method, to realize the circuit pattern 26 corresponding to the particular pattern.

In imprinting technology, the various processes such as photo resist laminating, etching, drilling for forming vias, etc., used in a conventional substrate process are replaced by a single imprinting process to form a circuit pattern on a dielectrics film.

In order to process the fine circuit pattern 26 by imprinting technology, the imprinting stamper 10, which is a mold on which a fine pattern is processed in relievo, is stacked on the insulation layer 20 as in FIG. 1 (a), and the imprinting stamper 10 is pressed onto the insulation layer 20 and demolded as in FIG. 1 (b), to process a fine pattern including via holes as in FIG. 1 (c). By applying the imprinting technology as thus, the fine circuit pattern 26 may be realized, complex processes may be replaced by one process, and the costs for the processes may be reduced.

The ink-jet printing technology has usually been used in the field of office automation (OA) and industries associated with marking packing materials and printing on clothing. However, with the development of functional ink including nano metal particles such as silver and nickel, etc., its applicability has gradually expanded, and now it is applied in forming circuit patterns on printed circuit boards using functional ink that includes nano metal particles.

That is, the circuit pattern forming technology by ink-jet printing, as illustrated in FIG. 2, is a method of moving the ink-jet head 30 according to the circuit pattern 26 data inputted beforehand, by ejecting the conductive ink 32 on the insulation layer 20 such that the circuit pattern 26 is printed.

With the modern ink-jet method, while it is possible to print various shapes of patterns using various types of ink, there is a limit to printing the pattern to a required thickness. In particular, the metal wiring has to be formed to a thickness greater than a certain value when printing electronic circuit patterns 26, and this is the part where many problems occur. The present embodiment enables the forming of circuit patterns 26 of a required thickness by combining the imprint pattern forming technology to the process of printing the circuit pattern 26 by ink-jet printing.

The imprint method is able to realize an intaglio pattern 24 of a required thickness on the insulation layer 20 by means of a relievo pattern 12 formed on the imprinting stamper 10. In other words, a trench of a particular shape may be made in the insulation layer 20.

Thus, by injecting the conductive ink 32 using the ink-jet method into the trench formed in the insulation layer 20 by applying the imprint method, the problems may be prevented of the spreading of the circuit pattern 26 due to the spreading of the ink, and the distortion of the shape of the circuit pattern 26 in the curing process due to the ink being trapped in the trench at a certain depth.

Also, the CAD (computer aided design) data of the circuit pattern 26 used for forming the imprinting stamper 10 may be utilized as it is, in the ink-jet printing process.

Figure 3:
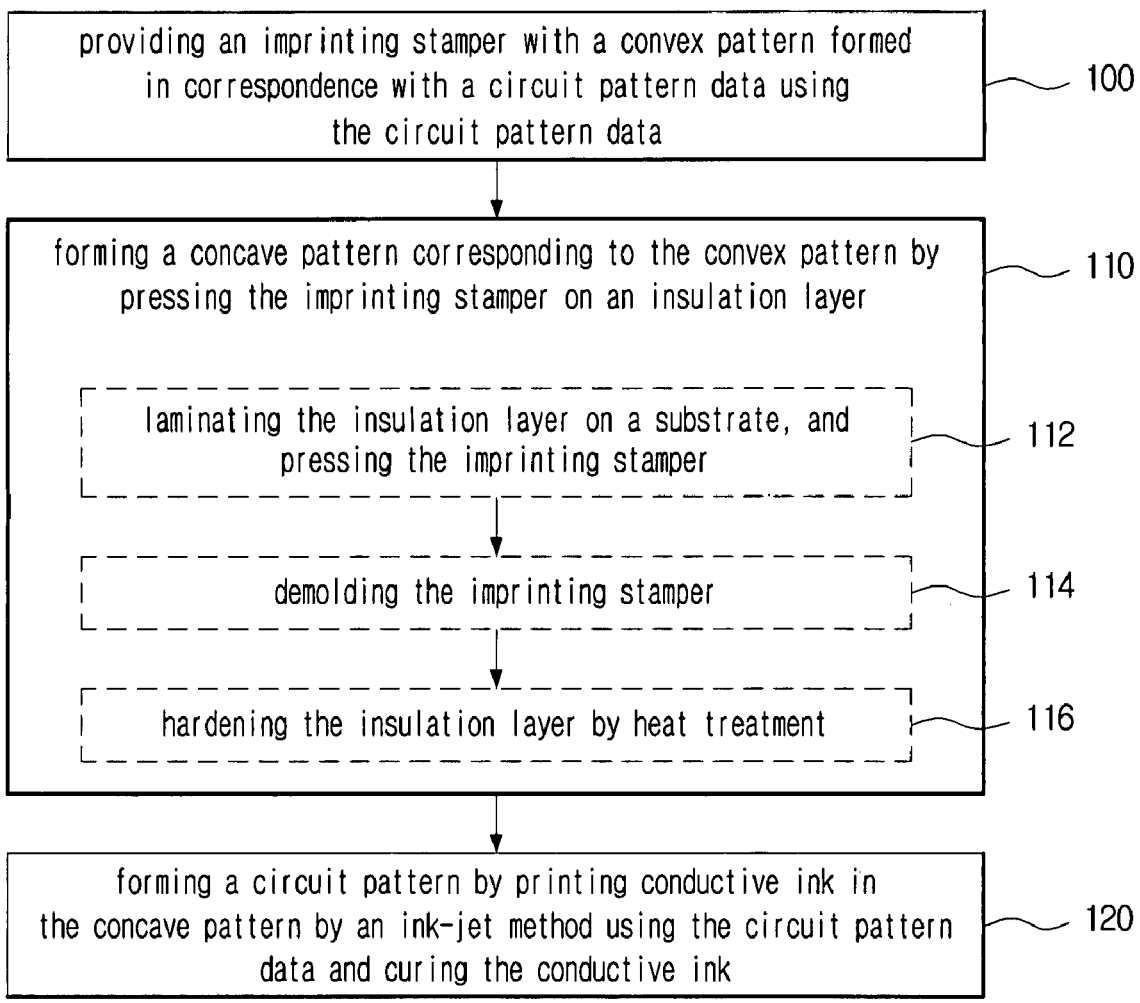
FIG. 3 is a flowchart illustrating a manufacturing method of a printed circuit board according to an embodiment of the present invention.
Figure 4:
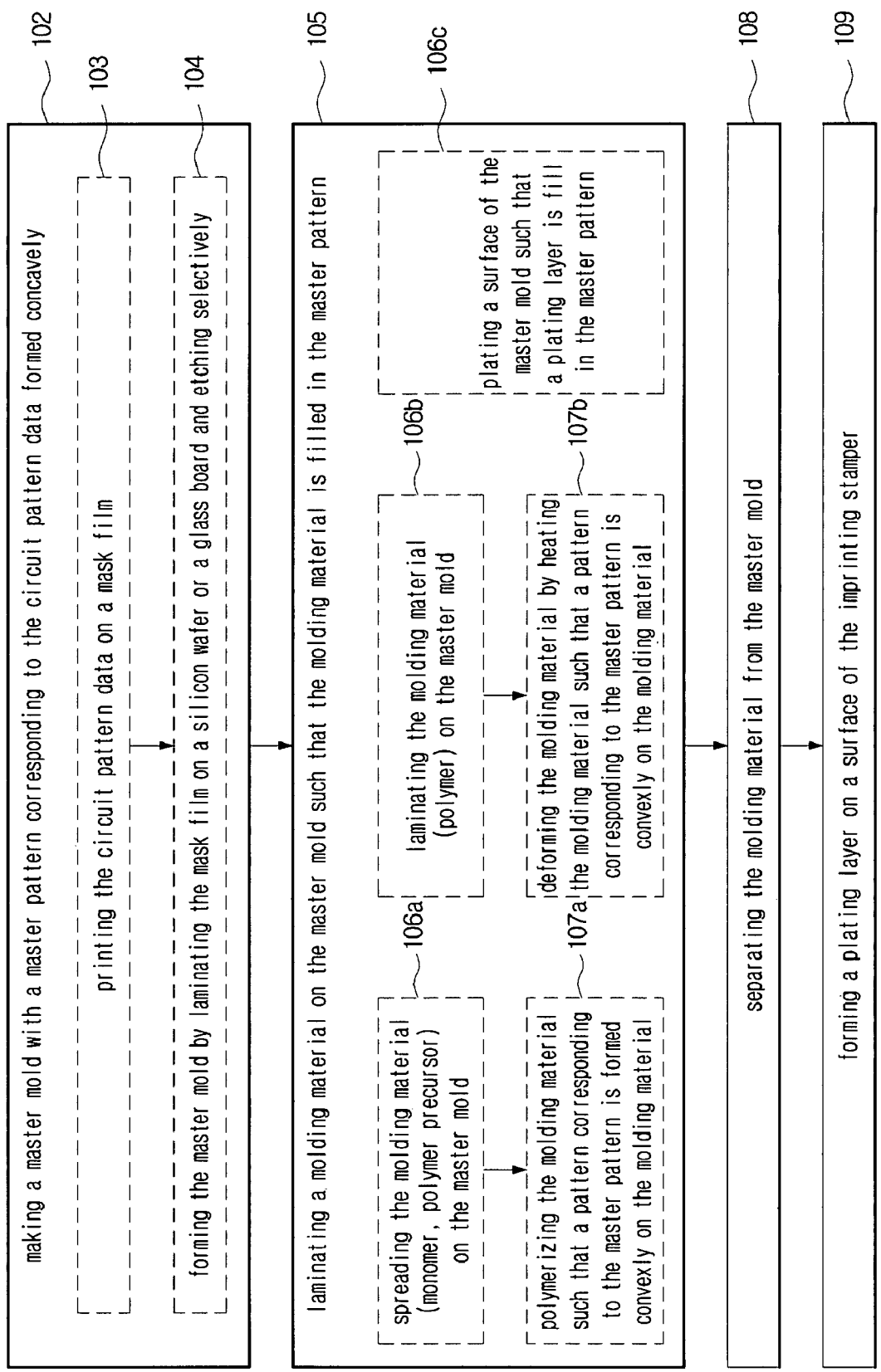
FIG. 4 is a flowchart illustrating a manufacturing method of an imprinting stamper according to an embodiment of the present invention.
Figure 5:
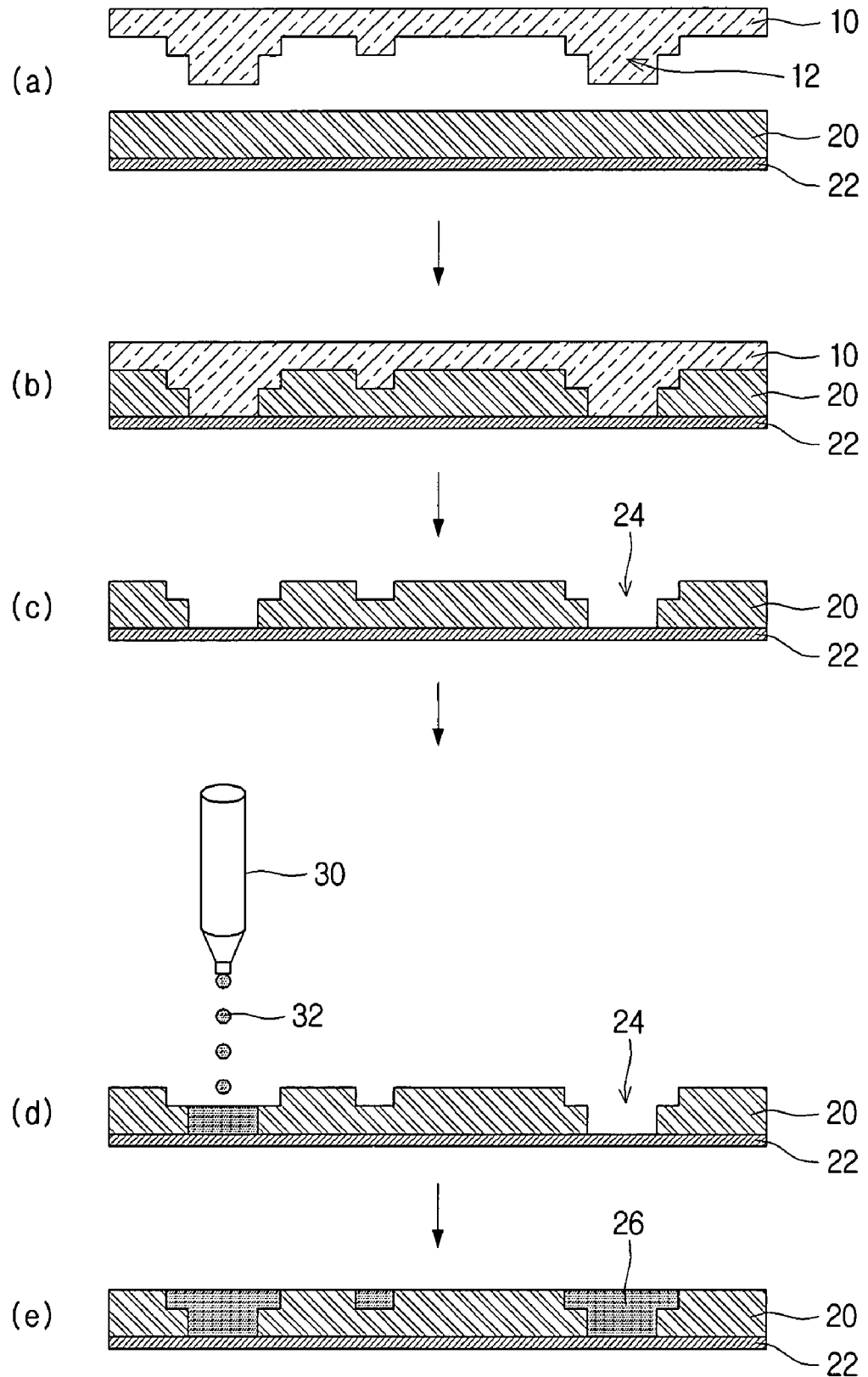
FIG. 5 is a flow diagram illustrating a manufacturing process of a printed circuit board according to an embodiment of the present invention.

FIG. 3 is a flowchart illustrating a manufacturing method of a printed circuit board according to an embodiment of the present invention, FIG. 4 is a flowchart illustrating a manufacturing method of an imprinting stamper according to an embodiment of the present invention, and FIG. 5 is a flow diagram illustrating a manufacturing process of a printed circuit board according to an embodiment of the present invention. In FIG. 5 are illustrated an imprinting stamper 10, a relievo pattern 12, an insulation layer 20, a substrate 22, an intaglio pattern 24, a circuit pattern 26, an ink-jet head 30, and conductive ink 32.

In order to manufacture the printed circuit board according to the present embodiment, first, the imprinting stamper 10 is prepared, where the relievo pattern 12 is formed by using circuit pattern data (100). As described in the following, the imprinting stamper 10 is manufactured by etching a silicon wafer, etc., and CAD data on the circuit pattern 26 is used in the process. That is, the imprinting stamper is manufactured such that a pattern corresponding to the circuit pattern 26 is formed protruding in relievo.

As is illustrated in FIG. 4, in order to manufacture an imprinting stamper according to the present embodiment, first, a master mold is manufactured (102). The master mold is a structure corresponding to a frame for manufacturing the imprinting stamper, and is manufactured by forming a pattern corresponding to the circuit pattern data in intaglio on a silicon wafer or a glass board. The pattern formed in intaglio on the master mold will be referred to hereinafter as the "master pattern".

In order to form the master pattern in intaglio on a member such as a silicon wafer, or a glass board, etc., the circuit pattern data is printed on a mask film (103), the mask film on which the circuit pattern is printed is laminated on a member such as a silicon wafer, and adequate selective etching processes are performed on the corresponding member, such as exposure, development, and etching, etc. By this, the master mold according to the present embodiment is formed (104).

Next, molding material is stacked on the master mold such that the molding material is filled in the master pattern (105). This is to form a relievo pattern that corresponds with the master pattern on a surface of the molding material, as the molding material is shaped according to the master pattern, where the molding material thus formed to have the relievo pattern formed on its surface is to be used as an imprinting stamper.

Methods of forming the molding material by stacking the molding material on the master mold include the methods of polymerizing a liquid monomer or a polymer precursor, stacking a polymer and heating, and filling a plating layer in the master pattern by plating the master mold, etc.

In the method of polymerizing a liquid monomer or a polymer precursor, liquid molding material is spread on the master mold such that the molding material is filled in the master pattern (106a), after which it is polymerized to be a solid polymer having a relievo pattern formed on its surface (107a). As described above, a master pattern is formed in accordance with the circuit pattern, so that a relievo pattern corresponding to the circuit pattern is formed on the surface of the molding material.

In the method of forming by heating after stacking a polymer, the molding material of a polymer is laminated on the master mold (106b), after which the polymer is heated such that it is transformed to a polymer having a relievo pattern formed on its surface (107b). When the heat is removed, the transformed polymer is hardened to a solid and is formed as an imprinting stamper.

The method of filling a plating layer in the master pattern by plating the master mold is to form the imprinting stamper, not by forming the molding material by polymerizing a polymer as in the methods described above, but by plating nickel, etc., directly on the master pattern (106c), that is, by using the plating layer as the molding material. As for the material for plating, the imprinting stamper may be manufactured with a material that can withstand the repetitive imprinting processes, such as nickel, etc.

After stacking and forming the molding material on the master mold by one of various methods such as those described above, the formed molding material is separated from the master mold (108).

Among the methods described above, after a polymer is stacked on the master mold and the molding material of polymer is formed, by plating the surface of the polymer (109), the manufacture of the imprinting stamper is completed. The stamper manufactured by forming a polymer may not have enough strength and hardness to transfer a circuit pattern by repeating the imprinting process on the insulation layer, so by depositing a metallic plating layer on the surface of a polymer, the imprinting stamper may be given sufficient hardness. Therefore, it may be advantageous to plate the surface of the polymer with a metallic material such as nickel, etc., that can withstand repetitive imprinting processes.

To summarize the manufacturing process of an imprinting stamper according to the present embodiment, the circuit pattern 26 is printed using CAD data on a mask film, the mask film on which the circuit pattern is printed is laminated on a silicon wafer and the like, and then by selective etching only on the parts where the circuit pattern 26 is not printed, the master mold is manufactured on which an intaglio pattern is formed.

Next, an imprinting stamper of a polymer material may be manufactured after the monomer, polymer precursor, or polymer is coated and solidified using a master mold, or an imprinting stamper of a metallic material may be manufactured after filling a plating layer in the intaglio pattern by plating the master mold with a metallic material and separating the plating layer.

As in the imprinting stamper 10 illustrated in FIG. 5 (a), the relievo pattern 12 includes not only the circuit pattern 26 but also the via holes, and it may be advantageous to form the intaglio pattern 24 corresponding to the circuit pattern 26 and the via holes on the insulation layer 20 simultaneously through the imprinting.

Next, the imprinting stamper 10 is pressed onto the insulation layer 20, and then the intaglio pattern 24 corresponding to the relievo pattern 12 is formed on the insulation layer 20 (110). This "imprinting" process includes laminating the insulation layer 20, where the intaglio pattern is to be formed, on the substrate 22 as in FIG. 5 (a), laminating and pressing the imprinting stamper 10 (112) as in FIG. 5 (b), and after the insulation layer 20 is deformed by pressing, demolding the imprinting stamper 10 (114) as in FIG. 5 (c), and afterwards heat-treating and hardening the insulation layer 20 (116), to form the intaglio pattern 24 on the insulation layer 20.

Of course, according to the material of the insulation layer 20, the insulation layer 20 may be heat-treated and partially hardened before demolding the imprinting stamper 10, and post processing processes such as chemical treatment may be applied to the insulation layer 20 on which the intaglio pattern 24 is formed after demolding the imprinting stamper 10.

On the insulation layer 20 where the intaglio pattern 24 is formed as thus, by printing the conductive ink 32 in the ink-jet method as in FIG. 5 (d), after filling the conductive ink 32 in the intaglio pattern 24, as in FIG. 5 (e), the circuit pattern 26 is formed to a required thickness by curing the conductive ink 32 (120). That is, according to the present embodiment, the thickness of the circuit pattern 26 is determined by the degree of depression in the insulation layer 20 in the imprinting process. Consequently, the thickness of the circuit pattern 26 formed on the insulation layer 20 is determined by how much the circuit pattern 26 is formed protruding from the imprinting stamper.

Ink-jet printing is a process of ejecting the conductive ink 32 and printing the circuit pattern 26, with ink-jet head 30 moving according to previously stored data, and thus the CAD data of the circuit pattern 26 used for forming the relievo pattern 12 on the imprinting stamper 10 described above may be used as it is for the data for driving the ink-jet head 30.

A printed circuit board manufactured by the manufacturing method of a printed circuit board described above is formed with the circuit pattern 26 buried in the insulation layer 20. That is, its structure is such that the intaglio pattern 24 is formed in the insulation layer 20 in correspondence with the location where the circuit pattern 26 is formed, and the conductive ink 32 is filled in the intaglio pattern 24 to compose the circuit pattern 26.

As described above, the intaglio pattern 24 formed in the insulation layer 20 is formed by the imprinting process, that is, a process of pressing the imprinting stamper 10, where the relievo pattern 12 corresponding to the circuit pattern 26 is formed, onto the insulation layer 20, and the filling of the conductive ink 32 is conducted by the ink-jet printing method, that is, a method of injecting the conductive ink 32 with the ink-jet head 30 moving according to circuit pattern data previously stored.

According to the present invention set forth as above, by injecting conductive ink in a groove processed by the imprinting method, it is possible to realize a circuit pattern of a required thickness, and the spreading of ink and the distortion of the pattern shape can be prevented in the curing process for conductive ink containing metal. Also, the circuit pattern CAD data used in the manufacturing of an imprinting stamper can be utilized again in the ink-jet printing process.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing a PCB, the method comprising:
    making an imprinting stamper with a relievo pattern formed in correspondence with a circuit pattern data using the circuit pattern data;
    forming an intaglio pattern corresponding to the relievo pattern by pressing the imprinting stamper on an insulation layer; and
    forming a circuit pattern by printing conductive ink in the intaglio pattern by an ink-jet head,
    wherein the printing is performed by inputting the circuit pattern data into the ink-jet head and operating the ink-jet head.

2. The method of claim 1, wherein the providing of the imprinting stamper comprises:
    making a master mold with a master pattern corresponding to the circuit pattern data formed in intaglio;
    laminating a molding material on the master mold such that the molding material is filled in the master pattern; and
    separating the molding material from the master mold.

3. The method of claim 2, wherein the making of the master mold comprises:
    printing the circuit pattern data on a mask film; and
    forming the master mold by laminating the mask film on a silicon wafer or a glass board and etching selectively.

4. The method of claim 2, wherein the molding material comprises one or more of a monomer and a polymer precursor, and the laminating comprises:
    spreading the molding material on the master mold; and
    polymerizing the molding material such that a pattern corresponding to the master pattern is formed in relievo on the molding material.

5. The method of claim 2, wherein the molding material comprises a polymer, and the laminating comprises:
    laminating the molding material on the master mold; and
    deforming the molding material by heating the molding material such that a pattern corresponding to the master pattern is formed in relievo on the molding material.

6. The method of claim 4, further comprising forming a plating layer on a surface of the imprinting stamper after the separating.

7. The method of claim 6, wherein the plating layer comprises nickel (Ni).

8. The method of claim 5, further comprising forming a plating layer on a surface of the imprinting stamper after the separating.

9. The method of claim 8, wherein the plating layer comprises nickel (Ni).

10. The method of claim 2, wherein the laminating comprises plating a surface of the master mold such that a plating layer is filled in the master pattern.

11. The method of claim 10, wherein the plating layer comprises nickel (Ni).

12. The method of claim 1, wherein the forming of the intaglio pattern comprises:
    laminating the insulation layer on a substrate, and pressing the imprinting stamper; and
    demolding the imprinting stamper.

13. The method of claim 12, further comprising hardening the insulation layer by heat treatment after the demolding.

14. The method of claim 1, wherein the forming of the circuit pattern comprises curing the conductive ink.

* * * * *

UNITED STATES PATENT AND TRADEMARK OFFICE
CERTIFICATE OF CORRECTION

PATENT NO. : 7,653,990 B2
APPLICATION NO. : 11/785096
DATED : February 2, 2010
INVENTOR(S) : Choon-Keun Lee It is certified that error appears in the above-identified patent and that said Letters Patent is hereby corrected as shown below:

Title Page; item (75);
First Page, Column 1 (Inventors), Line 3, change "Senug-Hyun" to --Seung-Hyun--.

Signed and Sealed this

First Day of June, 2010

David J. Kappos
*Director of the United States Patent and Trademark Office*